United States Patent
Abedifard et al.

(10) Patent No.: US 7,080,275 B2
(45) Date of Patent: Jul. 18, 2006

(54) METHOD AND APPARATUS USING PARASITIC CAPACITANCE FOR SYNCHRONIZING SIGNALS A DEVICE

(75) Inventors: Ebrahim Abedifard, Sunnyvale, CA (US); Frankie Roohparvar, Milpitas, CA (US); Dean Nobunaga, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 555 days.

(21) Appl. No.: 10/216,439

(22) Filed: Aug. 12, 2002

(65) Prior Publication Data

US 2004/0030945 A1    Feb. 12, 2004

(51) Int. Cl.
*G06F 1/12* (2006.01)

(52) U.S. Cl. .............. 713/401; 713/400; 713/600; 365/196

(58) Field of Classification Search ........... 713/401, 713/600, 400; 365/194, 196; 327/161
See application file for complete search history.

(56) References Cited

U.S. PATENT DOCUMENTS

| | | | | |
|---|---|---|---|---|
| 5,261,068 A * | 11/1993 | Gaskins et al. ........... 711/157 |
| 6,061,282 A * | 5/2000 | Tamaki ................. 365/201 |
| 6,111,796 A * | 8/2000 | Chang et al. ........... 365/196 |
| 6,178,133 B1 * | 1/2001 | Manning ............. 365/230.03 |
| 6,222,791 B1 * | 4/2001 | Becker et al. ........... 365/233 |
| 6,289,468 B1 * | 9/2001 | Godfrey ................ 713/401 |
| 6,385,101 B1 * | 5/2002 | Chang et al. ........... 365/196 |
| 6,401,213 B1 * | 6/2002 | Jeddeloh .............. 713/401 |
| 6,512,707 B1 * | 1/2003 | Miura et al. ........... 365/194 |
| 6,538,932 B1 * | 3/2003 | Ellis et al. ............ 365/194 |
| 6,653,877 B1 * | 11/2003 | Tsujino ................ 327/161 |
| 6,850,107 B1 * | 2/2005 | Gomm ................. 327/277 |
| 6,877,100 B1 * | 4/2005 | Nobunaga et al. ....... 713/400 |

FOREIGN PATENT DOCUMENTS

JP          09-191086      *  7/1997

* cited by examiner

*Primary Examiner*—Chun Cao
(74) *Attorney, Agent, or Firm*—Dickstein Shapiro Morin & Oshinsky LLP

(57) ABSTRACT

A method and apparatus for compensating address and control lines to account for clock delays within a memory device is disclosed. Latches are located directly within a the storage area of the memory device, so that the parasitic capacitance inherent within the address and control lines can be advantageously employed for introducing delay. The parasitic delay enables the clock, address, and control lines to be synchronized, yet does not require introducing delay blocks and so the overall speed of the memory device is improved.

20 Claims, 8 Drawing Sheets

(PRIOR ART)

*(PRIOR ART)*

METHOD AND APPARATUS USING PARASITIC CAPACITANCE FOR SYNCHRONIZING SIGNALS A DEVICE

FIELD OF THE INVENTION

The invention relates to a memory device which uses the parasitic delay inherent within signal lines to compensate for an inherently slower clock signal.

BACKGROUND OF THE INVENTION

It is well known for memory devices to latch address, data and command information before they are processed to a memory core, i.e. memory banks, blocks, or other type of storage areas. However, a problem with such latching is that the separate clock, address data, and control paths often have differing lengths and inherent delays. For example, FIG. 2 illustrates the an exemplary address signal line a clock signal XCLK used to latch in address data bit at latch 220. It is important that the address at the output of address buffer 208 be valid when the clock causes the transistor 216 to turn on and latch in the address data.

FIG. 1 shows the two important portions of the clock signal XCLK which are the setup time $t_{SETUP}$ which occurs right before the transistor 216 is turned on, and the hold time $t_{HOLD}$ which is the time during which the transistor 216 is on. The address, command, and data information on their associated signal lines has to be present and stable during the hold time $t_{HOLD}$, which allows for a small amount of variation in the shape of the rising edge of the clock signal. The rising edge of the XCLK signal should ideally occur during the middle of the time address, command, or data signal is present and available for latching.

Referring back to FIG. 2, the clock XCLK and ADDRESS signal lines typically have different signal propagation delay times. This is because the clock signal goes through a buffer 204 having a delay $t_{d1}$, a clock regenerator device 212 having an additional delay $t_{d2}$, and then the inherent delay $t_{d3}$ of the clock line before arriving at transistor 216. The clock regenerator 212 reduces noise and instability in a clock signal, but has the disadvantage of introducing delay in doing so. The transistor 216 controls the loading of the latch 220. The address lines, only one of which is shown in FIG. 2 (as well as the data and command signal lines) only goes through the input buffer 208, which imposes the delay $t_{IB}$ which also includes a delay between buffer 208 and transistor 216. Ideally, $t_{d1}$, $t_{d2}$, and $t_{d3}$ should equal $t_{IB}$. Unfortunately, this is seldom true, so that the signals on the address, command, and data lines arrive at different times than the clock signals, with the clock signal generally lagging behind the address, data, and control signals. In acute situations these time differences produce errors in the latching of the addresses, commands, and data.

One known way of compensating for the differing signal delays includes adding delay in the fastest signal path to balance against the slowest signal path. Thus, FIG. 3 shows a conventional approach where an additional delay 316 is positioned between the input buffer 208 and transistor 216 in the address line of FIG. 2. The delay 316 can be achieved with serial inverters (FIG. 4), or serial inverters with a capacitor 512 located between them (FIG. 5). The added delays adjust the timing of an address, data or control signal in a measurable, predictable way. However, it is desired to get the address, command, and data signals to the memory core as quickly as possible. Introducing delay at the input buffer, though necessary for proper signal latching synchronization, reduces the overall speed of the memory device. Also, once the delay 316 is introduced into a circuit there is no way to remove or make adjustments to it.

BRIEF SUMMARY OF THE INVENTION

In one aspect, the invention provides a memory device having an input buffer; a core memory storage area connected to the input buffer through a plurality of address, control, data and clock signal lines; a latch located within the core memory storage area and respectively associated with each address data, control line, whereby the parasitic capacitance of the address, data and control lines introduces sufficient delay to synchronize the arriving address, data, and command signals with clock signals transmitted along the clock lines. The memory device also has an optional delay associated with the input to each latch for adding a specific amount of delay if necessary, where the delay is adjustable. These and other features and advantages of the invention will be more clearly seen from the following detailed description of the invention which is provided in connection with the accompanying drawings.

DETAILED DESCRIPTION OF THE INVENTION

Figure 1:
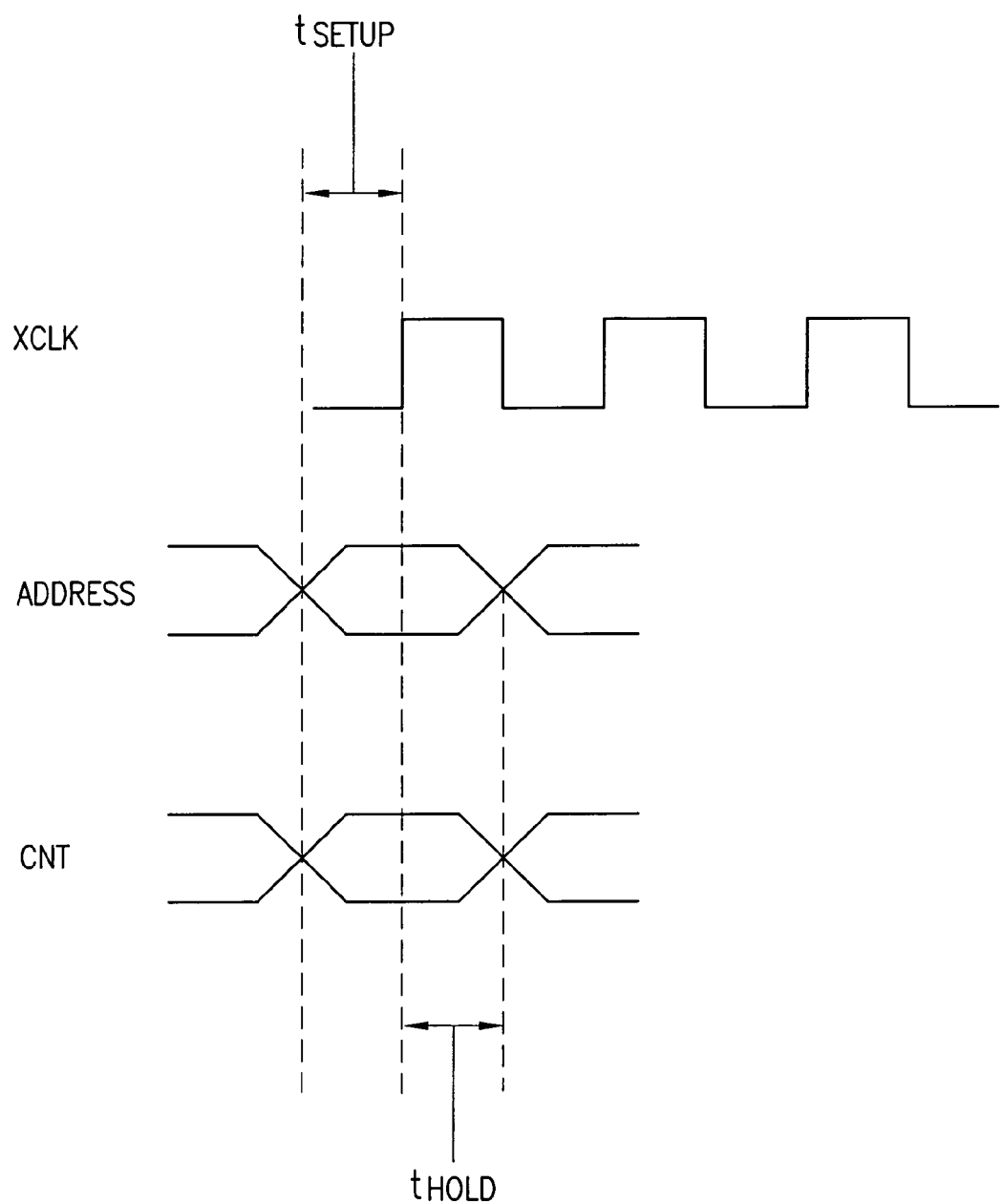
FIG. 1 is a timing diagram for a memory device.
Figure 2:
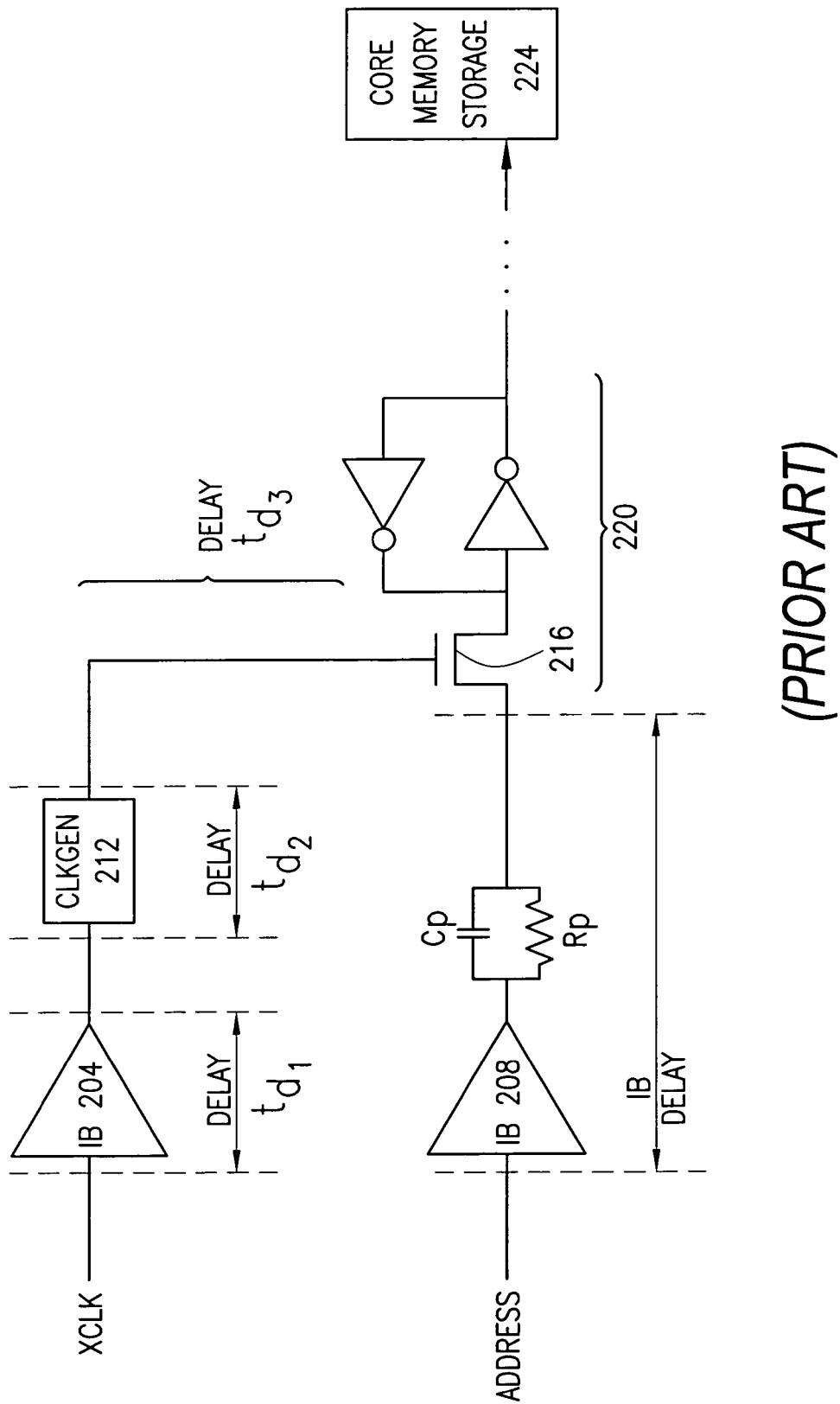
FIG. 2 is a block diagram of a conventional memory device.
Figure 3:
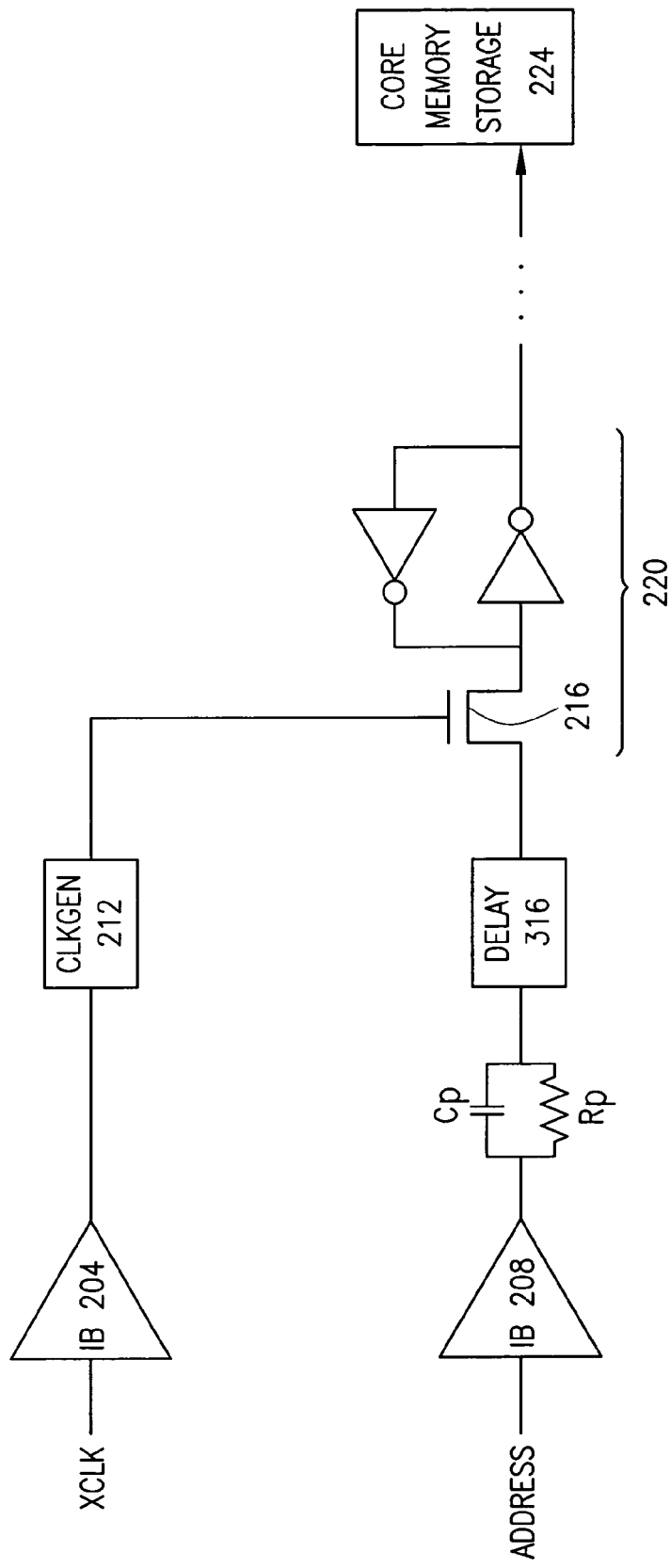
FIG. 3 is a block diagram of another conventional memory device.
Figure 4:
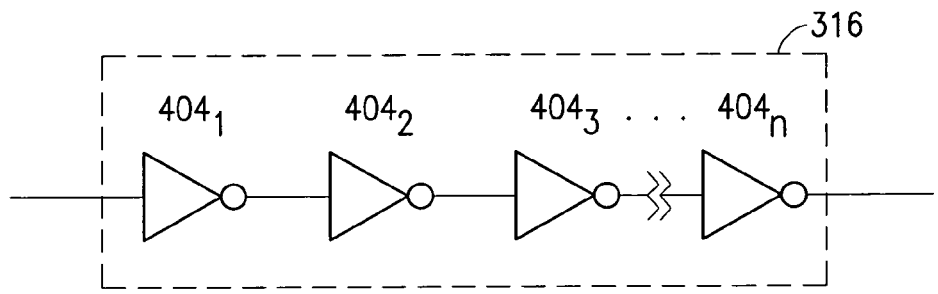
FIG. 4 is a block diagram of a conventional delay circuit.
Figure 5:
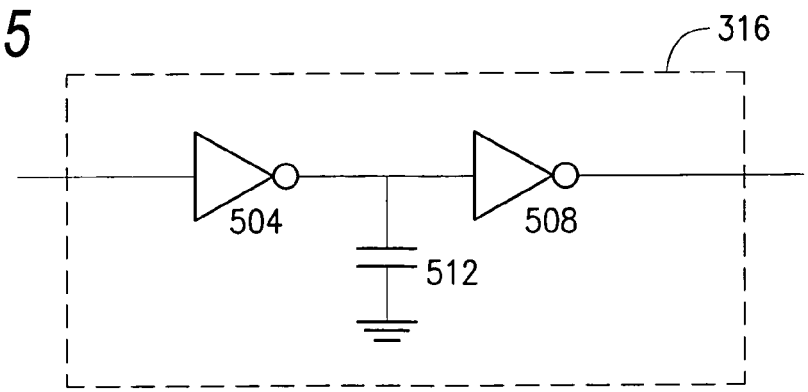
FIG. 5 is a block diagram of another conventional delay circuit.
Figure 6:
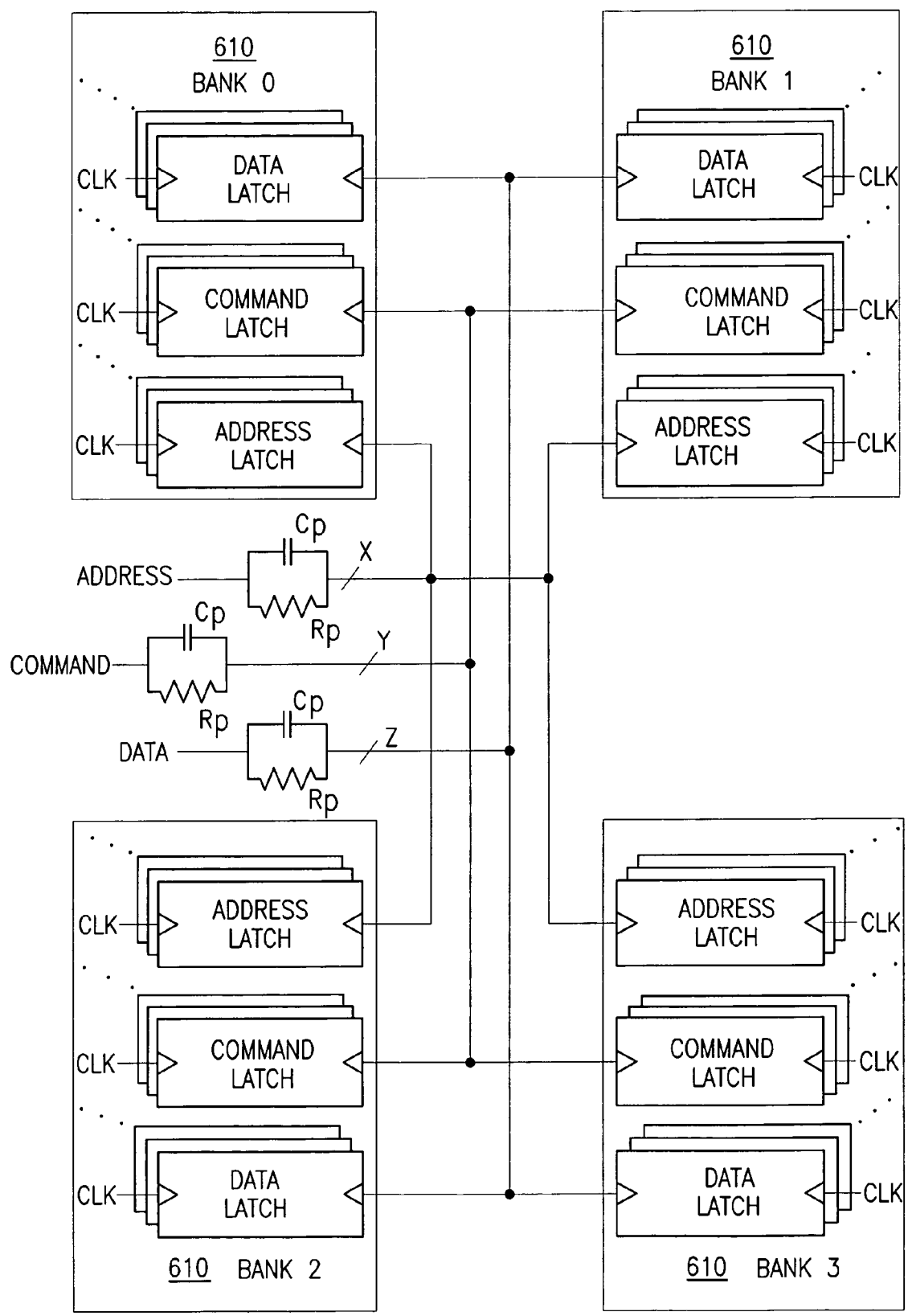
FIG. 6 is a block diagram of a memory device of the present invention.

FIG. 6 illustrates an embodiment of the present invention. Address, command, and data latches are located inside the memory banks 0–3, instead of input buffers, as in the circuits of FIGS. 2 and 3. As stated, clock signals tend to take longer to arrive than address, command, and data signals. Thus, the parasitic capacitance inherent in the signal lines of FIG. 6 between the input buffers and the banks 0–3 of the memory core supplies the necessary delay.

Although FIG. 6 shows only one of each type of address, command, and data latch within each bank, it is understood that there is one latch for every address, command, and data line. Because the FIG. 6 circuit latches data locally at the memory banks, it reduces the clock timing mismatches which could occur in the FIG. 2 arrangement. Nonetheless, there still may be instances where it is still necessary to introduce specific, quantifiable delay into the address, command, and data lines leading to the memory banks 0–3. Such delays may be necessary because of process variations during fabrication of the memory device. Accordingly, in a second embodiment the present invention also provides for adjustable delays which compensate, if needed, for variations in signal line propagation time.

Figure 7:
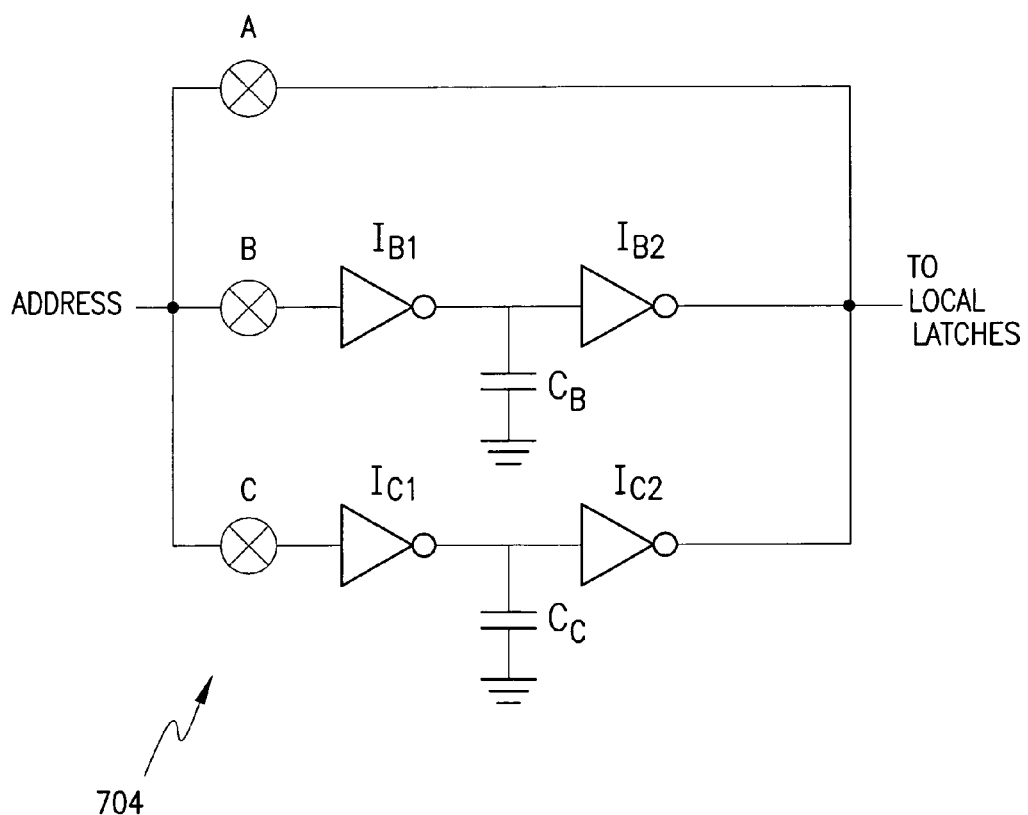
FIG. 7 is a block diagram of a delay circuit which may be used with the memory device of the present invention.

FIG. 7 shows an adjustable delay circuit 704 which may be provided for this purpose. FIG. 7 illustrates a delay circuit provided in the signal line of an address bit, but it should be understood that the illustrated delay circuit may be provided in each of the signal lines for the address, data, and command signals. Elements A, B, and C are switches which can be selectively opened and closed. Closing switch A with switch B and C open introduce no delay. Opening switch A and closing switch B introduces delay from the two inverters $I_{B1}$, $I_{B2}$ plus the capacitor $C_B$. Closing switch C by itself while leaving switches A and B open introduces delay from the two inverters $I_{C1}$, $I_{C2}$ plus the capacitor $C_C$, which has a different capacitance from the capacitor $C_B$. Finally, closing both switches B and C while leaving switch A open would achieve yet another delay because of the inverter pairs in parallel, combined with the separate capacitors $C_B$ and $C_C$. After memory device fabrication, the length and inherent delay of the address, data and control signal lines can be determined using digital sampling techniques. Consequently, delays in the address, command, and data signal lines can be introduced or adjusted by including suitable programmable delays in different lines to permit the address, data and control signals to arrive at the latches at the memory banks in a timely fashion.

Figure 8:
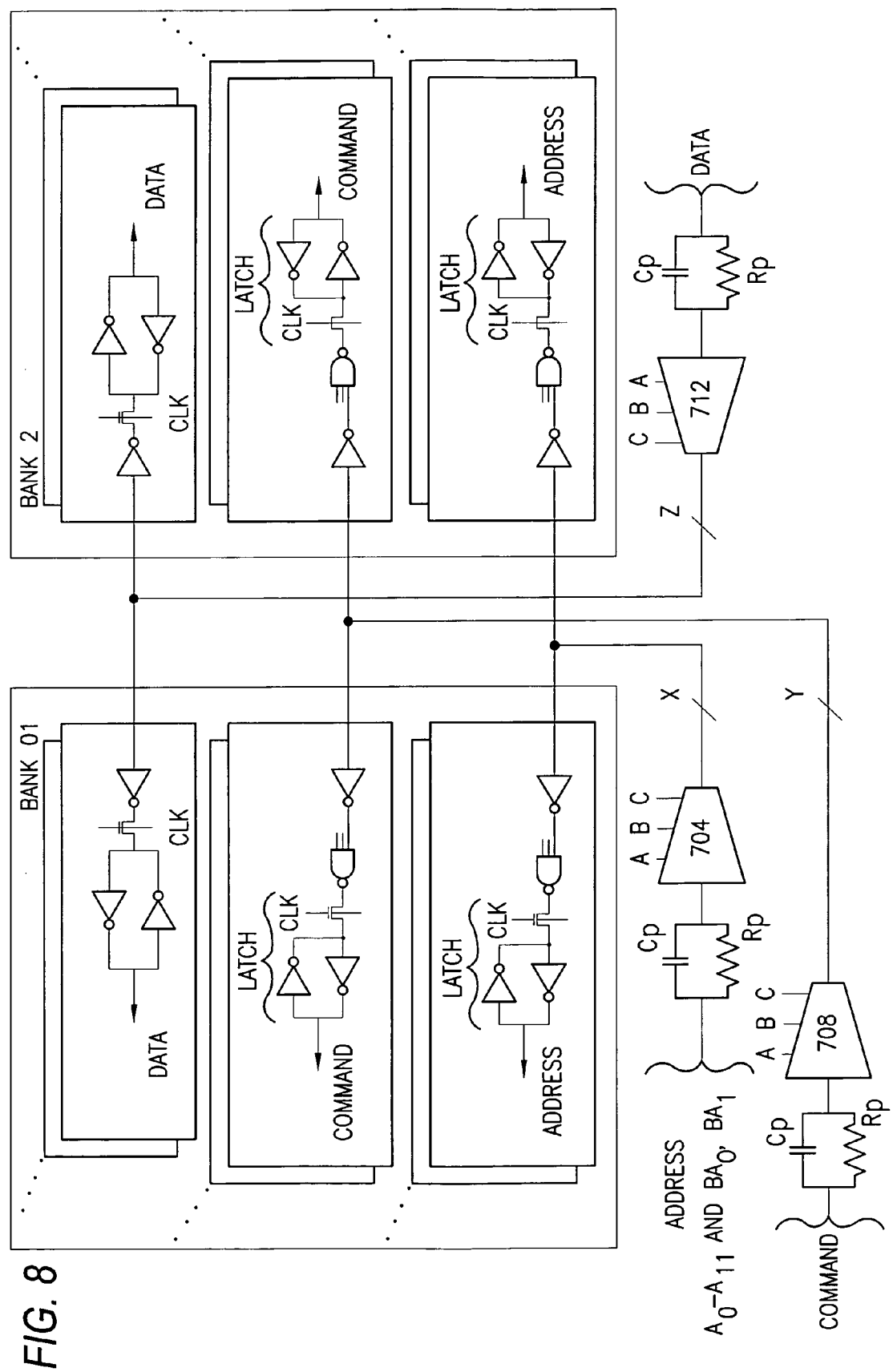
FIG. 8 is a block diagram of the memory device of the present invention showing command and address decoding.

FIG. 8 shows a more detailed block diagram of an embodiment of the present invention employing the adjustable delay circuit of FIG. 7, which for brevity shows only banks 0 and 2. Three sets of delay circuits 704 (address), 708 (control), and 712 (data) are shown, where each delay circuit is connected in a respective one of the address, command, and data signal lines which connect with the memory banks. The delay introduced by the delay circuits 704, 708, and 712 can be programmed by closing various combinations of switches A, B, and C (FIG. 7) for each delay circuit associated with each signal line. The invention may be used with many different types of devices including but not limited to DRAM, SRAM, SDRAM, FLASH, DDRRAM, etc.

Figure 9:
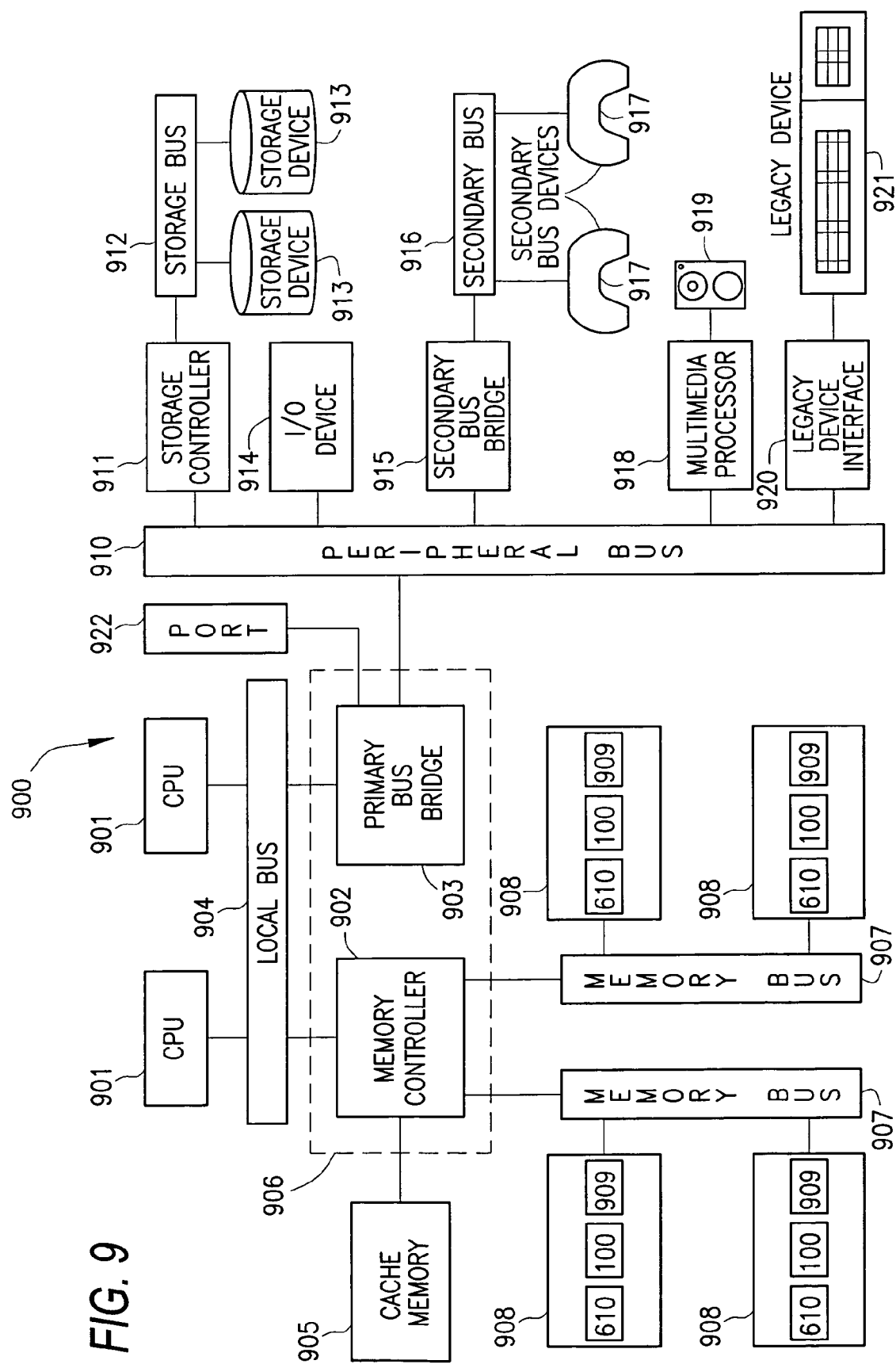
FIG. 9 shows a processor circuit incorporating the memory device of the present invention.

FIG. 9 illustrates an exemplary processing system 900 which may utilize an electronic device comprising a memory device 610 constructed in accordance with any of the embodiments of the present invention disclosed above in connection with FIGS. 6–8. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one memory device 610 of the present invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 916, each memory bus 916 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, an miscellaneous I/O device 914, a secondary bus bridge 915, a multimedia processor 918, and an legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900. In addition to memory device 931 which may contain a buffer device of the present invention, any other data input device of FIG. 9 may also utilize a buffer device of the present invention including the CPU 901.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900. In addition to memory device 931 which may contain a buffer device of the invention, any other data input device of FIG. 9 may also utilize a buffer device of the invention, including a CPU 901.

The processing system 900 illustrated in FIG. 9 is only an exemplary processing system with which the invention may be used. While FIG. 9 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory buffer devices 304. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

What is claimed is:

1. A memory device, comprising:
    an input buffer for receiving from a first signal line externally supplied information;

a core memory storage area connected to said input buffer through an internal signal line; and a latch, located within said core memory storage area and connected to said signal line for latching said externally supplied information on said internal signal line in response to an externally supplied clock signal received on a clock signal line;

wherein a predetermined timing relationship between said externally supplied clock signal and said externally supplied information is maintained at said latch by delaying said externally supplied information through a delay device comprising a parasitic capacitance of said first signal line.

2. The memory device of claim 1, wherein said externally supplied information comprises address information.

3. The memory device of claim 1, wherein said externally supplied information comprises command information.

4. The memory device of claim 1, wherein said externally supplied information comprises data to be written to said core memory storage area.

5. The memory device of claim 1, wherein said predetermined timing relationship is a synchronized relationship between said externally supplied clock signal and said externally supplied information.

6. The memory device of claim 1, further comprising:
an adjustable delay circuit located within said first signal line.

7. The memory device of claim 1, further comprising:
a clock regenerator coupled in series with said clock signal line.

8. A memory device, comprising:
a plurality of address input buffers for receiving address data;
a plurality of data input buffers for receiving data to be stored in a core memory storage area;
a plurality of address latches provided at said core memory storage area and respectively connected by a plurality of address signal lines and a first plurality of delay devices to said plurality of address input buffers, each of said first plurality of delay devices comprising a parasitic capacitance of a respective one of said address signal lines;
a plurality of data latches provided at said memory core storage area and respectively connected by a plurality of data signal lines and a second plurality of delay devices to said plurality of data input buffers, each of said second plurality of delay devices comprising a parasitic capacitance of a respective one of said data signal lines; and
a clock signal path for providing a clock signal for operating said latches to latch in incoming data;
wherein said clock signal, address data, and data to be stored are provided from an external source and a predetermined timing relationship between said clock signal and each of said address data and data to be store is respectively maintained at said pluralities of address and data latches by said first and second plurality of delay devices.

9. The memory device of claim 8, further comprising:
a plurality of command input buffers for receiving command data.

10. The device of claim 8, wherein each of said first and second pluralities of delay devices further comprise:
an adjustable delay circuit.

11. The memory device of claim 8, wherein said clock signal path further comprises:

a clock regenerator coupled in series with said clock signal line.

12. A processor system, comprising:
a processor; and
a memory circuit for exchanging data with said processor, said memory circuit comprising a memory device, said memory device comprising:
an input buffer for receiving from a first signal line externally supplied information;
a core memory storage area connected to said input buffer through an internal signal line; and
a latch, located within said core memory storage area and connected to said signal line for latching said externally supplied information on said internal signal line in response to an externally supplied clock signal received on a clock signal line;
wherein a predetermined timing relationship between said externally supplied clock signal and said externally supplied information is maintained at said latch by delaying said externally supplied information through a delay device comprising a parasitic capacitance of said first signal line.

13. The processor system of claim 12, wherein said externally supplied information comprises address information.

14. The processor system of claim 12, wherein said externally supplied information comprises command information.

15. The processor system of claim 12, wherein said externally supplied information comprises data to be written to said core memory storage area.

16. The processor system of claim 12, said delay device further comprises:
an adjustable delay circuit.

17. The processor system of claim 12, wherein said clock signal path further comprises:
a clock regenerator coupled in series with said clock signal line.

18. A method of operating a memory device, comprising:
transmitting, from an external source, a first signal via an input buffer to a memory core area along a first transmission path;
transmitting, from said external source, a clock signal in accordance with a predetermined timing relationship to said first signal, to said memory core area;
delaying the transmission said first signal along said first transmission path using at least a parasitic capacitance of said first transmission path to maintain said predetermined timing relationship; and
latching said first signal into said memory core area using said clock signal.

19. The method of claim 18, further comprising:
further delaying said first signal utilizing an adjustable delay circuit.

20. The method of claim 18, further comprising:
testing said memory device to determine signal variations due to fabrication; and
adjusting said delay circuit by closing one or more of a combination of switches therein so as to most closely accommodate the results of said testing.

* * * * *

UNITED STATES PATENT AND TRADEMARK OFFICE
CERTIFICATE OF CORRECTION

| | |
|---|---|
| PATENT NO. | : 7,080,275 B2 |
| APPLICATION NO. | : 10/216439 |
| DATED | : July 18, 2006 |
| INVENTOR(S) | : Ebrahim Abedifard et al. |

It is certified that error appears in the above-identified patent and that said Letters Patent is hereby corrected as shown below:

The title of this patent is corrected: "METHOD AND APPARATUS USING PARASITIC CAPACITANCE FOR SYNCHRONIZING SIGNALS A DEVICE" should read --METHOD AND APPARATUS USING PARASITIC CAPACITANCE FOR SYNCHRONIZING SIGNALS IN A DEVICE--.

The second line of the Abstract is corrected: "within a the" should read --within the--.

In the Specification, the following errors are corrected:

Column 1, line 19, "illustrates the an" should read --illustrates an--;

Column 1, line 19, "line a" should read --line having a--;

Column 1, line 33, "time address" should read --time the address--;

Column 3, line 48, "coupled the" should read --coupled to the--;

Column 4, line 2, "include" should read --includes--;

Column 4, line 12-13, "an miscellaneous" should read --a miscellaneous--;

Column 4, line 14 "an legacy" should read --a legacy--;

Column 4, line 15, "also coupled" shoud read --also be coupled--;

Column 4, line 29, "an local" should read --a local--;

Column 4, line 33, "an universal" should read --a universal--;

Column 4, line 34, "via to the" should read --via the --;

Column 4, line 37, "to one additional" should read --to additional--; and

Column 4, line 59, "system" should read --systems--.

UNITED STATES PATENT AND TRADEMARK OFFICE
CERTIFICATE OF CORRECTION

PATENT NO. : 7,080,275 B2
APPLICATION NO. : 10/216439
DATED : July 18, 2006
INVENTOR(S) : Ebrahim Abedifard et al.

It is certified that error appears in the above-identified patent and that said Letters Patent is hereby corrected as shown below:

In the Claims, the following errors are corrected:

Claim 8, column 5, line 55, "store" should read --stored--;

Claim 10, column 5, line 62, "The device" should read --The memory device--; and Claim 18, column 6, line 50, "transmission said" should read --transmission of said--.

Signed and Sealed this

Seventh Day of November, 2006

JON W. DUDAS
*Director of the United States Patent and Trademark Office*